United States Patent [19]  [11] 4,253,060
Chen  [45] Feb. 24, 1981

[54] RF SPECTRUM ANALYZER
[75] Inventor: Bor-Uei Chen, Northridge, Calif.
[73] Assignee: Hughes Aircraft Company, Culver City, Calif.
[21] Appl. No.: 43,411
[22] Filed: May 29, 1979
[51] Int. Cl.³ ............................................. G01R 23/16
[52] U.S. Cl. ................................ 324/77 K; 350/96.14
[58] Field of Search ........................ 350/162 R, 96.14; 324/77 K

[56] References Cited
U.S. PATENT DOCUMENTS
3,619,796  11/1971  Seidel .............................. 350/162 R
3,877,781  4/1975  Kaminow ......................... 350/96.14

OTHER PUBLICATIONS
IBM Technical Disclosure Bulletin, Brown and Rowe, Acoustic Light Deflector Chromatic Variation Compensation, vol. 13, No. 9, Feb. 1971, pp. 2634-2635.
An Integrated Optic RF Spectrum Analyzer, by M. C. Hamilton et al., Optical Engineering, vol. 16, No. 5.
Spectrum Analyzer Using Acousto-Optic Devices, by D. L. Hecht, Optical Engineering, vol. 16, No. 5.

Primary Examiner—Michael J. Tokar
Attorney, Agent, or Firm—Kenneth W. Float; W. H. MacAllister

[57] ABSTRACT
Apparatus is provided comprising a laser source, a collimating lens, a focussing lens and a detector array disposed along an optical path. A surface acoustic wave transducer is disposed between the collimating and focussing lenses and is adapted to modulate laser light provided by the laser source as a function of the amplitude and frequency of energy applied to the transducer. In accordance with the invention, a 90° Bragg diffraction grating disposed between the collimating lens and the transducer, is adapted for transmitting light of a predetermined frequency and predetermined polarization along the optical path. A specific embodiment incorporates the components on an integrated circuit chip.

4 Claims, 1 Drawing Figure

U.S. Patent  Feb. 24, 1981  4,253,060
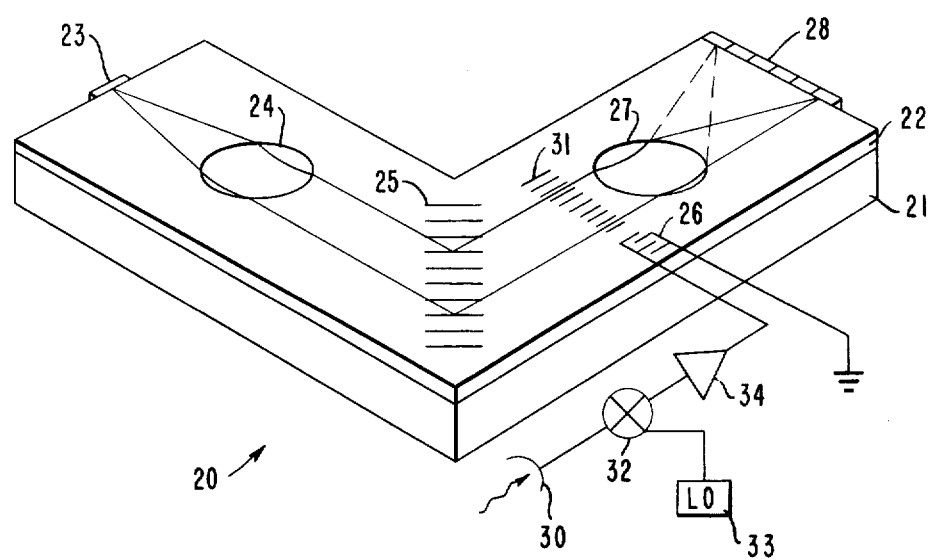

RF SPECTRUM ANALYZER

The present invention relates generally to RF spectrum analyzers, and more particularly, to integrated optic spectrum analyzers.

BACKGROUND

RF spectrum analyzers are known in the art and considerable interest presently exists in such analyzers which are fabricated using integrated optics processes. For a better understanding of these systems and the components thereof, see "Design, Fabrication and Integration of Components for an Integrated Optic Spectrum Analyzer," by M. K. Barnoski et al, 1978 Ultrasonics Symposium Proceedings, IEEE, and "Diffraction-Limited Geodesic Lens for Integrated Optics Circuits," by B. Chen et al, Applied Physics Letters, 33(6), Sept. 15, 1978.

Generally, optical spectrum and analyzers include a laser source, collimating optics, focussing optics, a detector array and a transducer for modulating laser light as a function of the RF frequency of the signal applied to the transducer. Ideally, the laser source provides light generated by the process of stimulated emission which is at a single wavelength and fixed polarization. However, in all semiconductor lasers, such as gallium aluminum arsenide, spontaneous emissions occur which are broadband in wavelength and have mixed polarization.

The spontaneous emission problems result in optical noise being introduced into the system thus reducing the dynamic range of the system. Prior art solutions to this problem have involved attempts to deposit a multilayer interferometric filter directly on the detector array to filter out the spontaneous emission signals. This, however, is a very difficult task from a manufacturing standpoint. Moreover, the frequency filtering performance of the interferometric filter is severely degraded for a converging beam impinging upon the detector array.

Additionally, where such spectrum analyzers are fabricated on an integrated circuit chip using integrated optics techniques, system performance is limited by the length of the crystals used as a substrate material. For instance, lithium niobate crystals cannot be grown along one crystal lattice axis (X-axis), while growth along the other two axes may be on the order of 10 inches, or so.

The frequency resolution of the analyzer is substantially determined by the focal length of the focussing optics and its detector size. Current state of the art detectors are generally used in these analyzers and have an element size on the order of 8 microns, which is the limit of present detector technology. Thus, to increase the frequency resolution it is necessary to increase the focal length of the focussing optics given the limited chip size available. For lithium niobate crystals, for example, the maximum length attainable along the X-axis is about $2\frac{3}{4}$ inches. The acoustic waves must propagate along the Z-axis, and thus the collimating and focussing optics are arranged along the X-axis, thus limiting the maximum focal length to about one inch.

SUMMARY OF THE INVENTION

Accordingly, it is an object of the present invention to provide an improved RF spectrum analyzer which substantially eliminates noise due to spontaneous emission in the laser source.

A further object of the present invention is to provide an RF spectrum analyzer which has a large dynamic range and improved frequency resolution.

In accordance with these and other objects and features of the present invention, there is provided an RF spectrum analyzer comprising a laser source and a first lens adapted for collimating laser light provided by the laser source. A second lens is provided for focussing the laser light onto the detector array disposed at the focal plane thereof. A surface acoustic wave transducer is disposed between the first and second lenses and adjacent to an optical path therebetween. The transducer is adapted to provide surface acoustic waves which modulate the collimated laser light provided by the first lens by means of acousto-optic Bragg interaction as a function of the frequency of an applied RF signal.

In accordance with the present invention, a 90° Bragg deflection grating which is adapted for transmitting light of a predetermined frequency and predetermined polarization is disposed between the first lens and the surface acoustic wave transducer. The grating allows use of a longer focal length lens as the focussing lens thus providing the analyzer with improved frequency response and resolution.

A specific embodiment applies the principles of the present invention to an RF spectrum analyzer disposed on an integrated circuit chip. The system components are substantially the same as above, but are fabricated by integrated optics processes. The lenses are geodesic lenses fabricated by an ultrasonic impact grinding procedure, or the like, and the laser light travels in integrated optic waveguide channels between the components of the system. The chip is fabricated in the shape of an L which allows for the longer focal length focussing lens to be incorporated. The transducer sets up acoustic waves in the top surface of the chip whose amplitude and frequency are functionally related to the RF signal applied to the transducer. The acoustic waves act as a Bragg diffractor which interacts with the laser light to diffract the light from its original path in proportion to the amplitude and frequency of the RF signal.

BRIEF DESCRIPTION OF THE DRAWING

The foregoing and other objects and features of the present invention may be more readily understood with reference to the following detailed description taken in conjunction with the accompanying drawing, in which like reference numerals designate like structural elements, and in which:

The single FIGURE of the drawing is an illustration of an RF spectrum analyzer disposed on an integrated circuit chip and made in accordance with the principles of the present invention.

DETAILED DESCRIPTION

Referring to the drawing, there is shown an RF spectrum analyzer 20 disposed on an integrated circuit chip and made in accordance with the principles of the present invention. The chip is comprised of a substrate 21 onto which is fabricated a uniform top surface 22 of an optically transmissive material, a layer of lithium niobate doped with titanium, or the like. The titanium is diffused into the substrate 21 which causes an optical boundary layer to be formed, which in turn allows for total internal reflection of laser light within the top surface 22. The top surface is nominally on the order of 2 microns thick.

The chip is in the shape of an L, with each leg being about 2¾ inches in length. A laser source 23 is disposed at an end of one leg of the chip and is adapted to provide light at a particular wavelength and a particular polarization. A geodesic collimating lens 24 having its primary focus at the output of the laser source 23 is provided in the surface of the substrate 21 by means of an ultrasonic impact grinding process, or the like, and is fabricated prior to the deposition process.

At the corner of the elbow of the chip is disposed a 90° Bragg deflection grating 25. The grating 25 may be formed by various techniques known in the art, such as an etching process, or the like. The grating 25 is etched into the top surface 22, with the etched lines being on the order of 500 to 1,000 Å deep and spaced approximately 2,500 Å. apart. The spacing depends upon the frequency of the RF signals which are to be processed by the RF spectrum analyzer 20. The grating 25 allows only one wavelength at one polarization to be deflected and is essentially transparent to all other wavelengths. The grating 25 thus acts as a filter with respect to applied laser energy. The deflection efficiency and filter bandwidth are determined by the grating depth and number of grating lines. It is also possible to modulate the grating depth to generate a deflected beam of uniform intensity.

A second geodesic lens 27 is disposed in the other leg of the chip and is adapted to focus on the collimated laser light provided by the collimating lens 24. A detector array 28 is disposed at the end of the chip at the focal plane of the second lens 27. An optical path is thus formed in the shape of an L which intersects the laser source 23, first geodesic lens 24, grating 25, second geodesic lens 27 and detector array 28.

A surface acoustic wave transducer 26 is disposed between the grating 25 and the second lens 27 adjacent to the optical path near one edge of the chip. The transducer 26 comprises metal electrodes deposited on the top surface 22. The transducer is coupled to an RF signal source 30, such as an antenna, or the like.

In operation, the laser source 23 such as gallium aluminum arsenide, or the like, provides coherent light at a particular wavelength and polarization. However, spontaneous emission simultaneously occurs, along with the stimulated emission. The spontaneous emission is broadband in wavelength and is of mixed polarization. Thus, the light provided by the laser source 23 is optically noisy.

The light is transmitted by total internal reflection in the top surface 22 to the collimating lens 24 which collimates the light and applies it to the grating 25. The light interacts with the grating, and only the desired wavelength of light, is deflected toward the detector array 28 while the remaining energy is merely transmitted along the original light path. Consequently, the optical noise is removed from the signal by the grating 25. In addition, the grating 25 acts as a polarization filter and selects only a single polarization component to be transmitted thereby.

The light is then focussed onto the detector array 28 by the second lens 27. It is to be understood that the collimating and focussing of the lenses 24, 27 is done in one dimension only, in that there is no focussing in the direction orthogonal to the top surface 22.

Signals from RF signal source 30, which may be a radar antenna, for example, are down converted to the frequency range of the transducer by means of a mixer 32 and a local oscillator (LO) 33. The output signals from the mixer 32 are processed by amplifier 34, and the transducer 26 is activated by the output signals from the amplifier 34. The transducer 26 receives signals from the RF signal source 30 and applies an electrical field to the top surface 22. Additionally, the transducer 26 causes a surface acoustic wave 31 to propagate along the surface which physically deforms the top surface 22. The acoustic wave 31 acts like a Bragg deflector in that the laser light interacts with the acoustic wave 31 and is deflected in proportion to the frequency of the RF signals which generate the acoustic wave. The laser light is thus acousto-optically modulated at the RF frequency.

The deflected laser light is focussed onto one of a plurality of detector elements of the detector array 28. The output of each particular detector element is indicative of the frequency of the RF energy. Additionally, the amplitude of the detected signal is indicative of the strength of the RF energy received by the RF signal source 30.

Also, the 90° Bragg deflection grating 25 allows for a substantial increase in the optical path length of the analyzer 20. Accordingly, a longer focal length focussing lens 27 may be used which enhances the frequency resolution capability of the RF spectrum analyzer 20.

Thus, there has been described an improved RF spectrum analyzer which substantially eliminates noise due to spontaneous emissions in the laser source, and additionally provides the analyzer with a larger dynamic range and improved frequency resolution since a longer focal length focussing lens may be incorporated.

It is to be understood that the above-described embodiment is merely illustrative of but a small number of the many possible specific embodiments which can represent applications of the principles of the present invention. Numerous and varied other arrangements can readily be devised in accordance with these principles by those skilled in the art without departing from the spirit and scope of the invention. Clearly, the present invention is not limited to a configuration on an integrated circuit chip, and may be constructed using discrete components. However, use of current state of the art integrated optics techniques allows for many advantages over a conventional discrete component configuration.

What is claimed is:

1. An RF spectrum analyzer comprising a laser source, a first lens adapted for collimating laser light provided by said laser source, a second lens for focussing the collimated light provided by said first lens, a detector array disposed at the focal plane of said second lens, and a surface acoustic wave transducer disposed between said first and second lenses and adjacent to an optical path therebetween, said transducer being adapted to provide surface acoustic waves which modulate the collimated light provided by said first lens by means of acousto-optic Bragg interaction, wherein the improvement comprises:
   a 90° Bragg deflection grating disposed in the optical path between said first lens and said surface acoustic wave transducer and adapted for providing light of a predetermined frequency and predetermined polarization to be transmitted thereby along said optical path.

2. An RF spectrum analyzer disposed on a single integrated circuit chip, said analyzer comprising a laser source, a first geodesic lens for collimating laser light provided by said laser source, a second geodesic lens for focussing the collimated light provided by said first geodesic lens, a detector array disposed at the focal plane of said second geodesic lens, and a surface acoustic wave transducer disposed between said first and second geodesic lenses and adjacent to an optical path therebetween, and adapted to provide surface acoustic waves which modulate the collimated light provided by said first geodesic lens by means of acousto-optic Bragg interaction, wherein the improvement comprises:

a 90° Bragg deflection grating disposed in the optical path between said first geodesic lens and said surface acoustic wave transducer and adapted for providing light of a predetermined frequency and predetermined polarization to be transmitted thereby along said optical path.

3. The spectrum analyzer of claim 2, wherein said integrated circuit chip is configured in the shape of an L.

4. The spectrum analyzer of claim 2, wherein said integrated circuit chip is configured in the shape of an I and whereby said 90° Bragg deflection grating provides for use of longer focal length lens as said geodesic lens thus providing said analyzer with improved frequency response and resolution.

* * * * *